(12) United States Patent
Hsu et al.

(10) Patent No.: US 10,459,346 B2
(45) Date of Patent: *Oct. 29, 2019

(54) FLOWS OF OPTIMIZATION FOR LITHOGRAPHIC PROCESSES

(71) Applicant: ASML Netherlands B.V., Veldhoven (NL)

(72) Inventors: Duan-Fu Stephen Hsu, Fremont, CA (US); Rafael C. Howell, Santa Clara, CA (US); Xiaofeng Liu, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/036,732

(22) Filed: Jul. 16, 2018

(65) Prior Publication Data

US 2018/0341186 A1  Nov. 29, 2018

Related U.S. Application Data

(63) Continuation of application No. 15/303,199, filed as application No. PCT/EP2015/053099 on Feb. 13, 2015, now Pat. No. 10,025,201.

(Continued)

(51) Int. Cl.
*G03F 7/20* (2006.01)
*G03F 1/36* (2012.01)
*G03F 1/70* (2012.01)

(52) U.S. Cl.
CPC ............ *G03F 7/70641* (2013.01); *G03F 1/36* (2013.01); *G03F 1/70* (2013.01); *G03F 7/705* (2013.01);

(Continued)

(58) Field of Classification Search
CPC ............ G03F 7/70641; G03F 7/70125; G03F 7/70433; G03F 7/70558

(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| JP | 2008078652 | 4/2008 |
| JP | 2012220955 | 11/2012 |

(Continued)

OTHER PUBLICATIONS

International Search Report and Written Opinion dated Jun. 12, 2015 in corresponding International Patent Application No. PCT/EP2015/053099, 9 pages.

(Continued)

*Primary Examiner* — Hung Nguyen
(74) *Attorney, Agent, or Firm* — Pillsbury Winthrop Shaw Pittman LLP

(57) ABSTRACT

A method to improve a lithographic process for imaging a portion of a design layout onto a substrate using a lithographic projection apparatus having an illumination system and projection optics, the method including: obtaining an illumination source shape and a mask defocus value; optimizing a dose of the lithographic process; and optimizing the portion of the design layout for each of a plurality of slit positions of the illumination source.

20 Claims, 15 Drawing Sheets

Related U.S. Application Data

(60) Provisional application No. 61/979,232, filed on Apr. 14, 2014.

(52) U.S. Cl.
CPC ...... *G03F 7/70125* (2013.01); *G03F 7/70191* (2013.01); *G03F 7/70433* (2013.01); *G03F 7/70441* (2013.01); *G03F 7/70558* (2013.01)

(58) Field of Classification Search
USPC .............................................. 355/52, 53, 55
See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 7,703,069 | B1 | 4/2010 | Liu et al. |
| 8,200,468 | B2 | 6/2012 | Ye et al. |
| 8,438,508 | B2 | 5/2013 | Liu |
| 8,584,056 | B2 | 11/2013 | Chen et al. |
| 8,893,060 | B2 | 11/2014 | Feng et al. |
| 10,025,201 | B2 * | 7/2018 | Hsu ............ G03F 1/36 |
| 2004/0197672 | A1 * | 10/2004 | Weed ........ G03F 7/70091 430/5 |
| 2006/0046168 | A1 | 3/2006 | Fukuhara |
| 2008/0068569 | A1 | 3/2008 | Mulckhuyse et al. |
| 2010/0141925 | A1 | 6/2010 | Cao et al. |
| 2010/0315614 | A1 | 12/2010 | Hansen |
| 2012/0052418 | A1 | 3/2012 | Tian et al. |
| 2012/0113404 | A1 | 5/2012 | Hsu et al. |
| 2012/0117522 | A1 * | 5/2012 | Feng ............. G03F 1/70 716/54 |
| 2012/0254813 | A1 | 10/2012 | Chen et al. |
| 2013/0185681 | A1 | 7/2013 | Liu et al. |
| 2014/0047397 | A1 | 2/2014 | Ye et al. |
| 2014/0123082 | A1 * | 5/2014 | Akhssay ...... G06F 17/5081 716/52 |
| 2014/0146311 | A1 | 5/2014 | Mikami |
| 2015/0378262 | A1 | 12/2015 | Liu et al. |

FOREIGN PATENT DOCUMENTS

| | | |
|---|---|---|
| KR | 1020120113198 | 10/2012 |
| KR | 1020130114138 | 10/2013 |
| WO | 2010/059954 | 5/2010 |
| WO | 2014/127985 | 8/2014 |
| WO | 2015/139951 | 9/2015 |

OTHER PUBLICATIONS

Xiaofeng Liu et al., "EUV source-mask optimization for 7 nm node and beyond," Proc. of SPIE, vol. 9048, pp. 90480Q-1-90480Q-11 (Apr. 17, 2014).

Philip C.W. Ng et al., "Fully model-based methodology for simultaneous correction of extreme ultraviolet mask shadowing and proximity effects," J. Micro/Nanolith MEMS MOEMS, vol. 10, No. 1, pp, 013004-1-013004-13 (2011).

Tamer H. Coskun et al., "EUV OPC modeling and correction requirements," Proc. of SPIE, vol. 9048, pp. 90480W-1-90480W-14 (Mar. 18, 2014).

Hua Song et al., "Shadowing effect modeling and compensation for EUV lithography," Proc. of SPIE, vol. 7969, pp. 79691O-1-79691O-9 (Mar. 17, 2011).

Chris Spence, "Full-Chip Lithography Simulation and Design Analysis—How OPC Is Changing IC Design," Proc. of SPIE, vol. 5751, pp. 1-14 (2005).

Yu Cao et al., "Optimized Hardware and Software For Fast, Full Chip Simulation," Proc. of SPIE, vol. 5754, pp. 407-414 (2005).

Alan E. Rosenbluth et al., "Optimum mask and source patterns to print a given shape," J. Microlith., Microfab., Microsys., vol. 1, No. 1, pp. 13-30 (Apr. 2002).

Yuri Granik, "Source optimization for image fidelity and throughput," J. Microlith., Microfab., Microsys., vol. 3, No. 4, pp. 509-522 (Oct. 2004).

Robert Socha et al., "Simultaneous Source Mask Optimization (SMO)," Proc. of SPIE, vol. 5853, pp. 180-193 (2005).

Korean Office Action dated Feb. 14, 2018 in corresponding Korean Patent Application No. 10-2016-7031687, with English translation, 10 pages.

Stephen Hsu et al., "Source-mask co-optimization: Optimize Design for Imaging and Impact of Source Complexity on Lithography Performance," Proc. of SPIE, vol. 7520, pp. 75200D-1-75200D-11 (2009).

Stephen Hsu et al., "An Innovative Source-Mask co-Optimization (SMO) Metehod for Extending Low k1 Imaging," Proc. of SPIE, vol. 7140, pp. 714010-1-714010-10 (2008).

Korean Notice of Allowance issued in corresponding Korean Patent Application No. 10-2016-7031687, dated May 1, 2019

* cited by examiner

FLOWS OF OPTIMIZATION FOR LITHOGRAPHIC PROCESSES

CROSS-REFERENCE TO RELATED APPLICATIONS

This application is a continuation of U.S. patent application Ser. No. 15/303,199, filed Oct. 10, 2016, now U.S. Pat. No. 10,025,201, which is the U.S. national phase entry of PCT patent application no. PCT/EP2015/053099, which was filed on Feb. 13, 2015, which claims the benefit of priority of U.S. provisional patent application No. 61/979,232, which was filed on Apr. 14, 2014, each of which is incorporated herein in its entirety by reference.

TECHNICAL FIELD

The description herein relates to lithographic apparatuses and processes, and more particularly to a method or tool for optimization of an illumination source and/or patterning device/design layout for use in a lithographic apparatus or process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

A computer-implemented method to improve a lithographic process for imaging a portion of a design layout onto a substrate using a lithographic projection apparatus comprising an illumination source and projection optics, the method comprising: obtaining a source shape and a mask defocus value; optimizing a dose of the lithographic process; optimizing the portion of the design layout for each of a plurality of slit positions of the illumination source.

In an embodiment, the method further comprises optimizing the design layout wherein transmission at all locations of the portion of the design layout is not restricted to a number of discrete values.

In an embodiment the method further comprises placing one or more assist features into the portion of the design layout.

In an embodiment of the method, the assist features comprise a sub resolution assist feature, a printable resolution assist feature, or a combination thereof.

In an embodiment the method further comprises obtaining a model of the source, a model of the portion of the design layout, a model of the projection optics, or a combination thereof, wherein the models are configured to simulate an aerial image produced by the source, the portion of the design layout and the projection optics.

In an embodiment of the method, the models are configured for calculating an aerial image by using the Abbe or Hopkins' formula.

In an embodiment of the method, the step of optimizing the dose of the lithographic process comprises using at least one of the models.

In an embodiment the method comprises determining for each of the slit positions, a process window.

In an embodiment of the method, the step of obtaining the models comprises optimizing the illumination source and the portion of the design layout using a three-dimensional mask model, under an assumption that the illumination source is a freeform source.

In an embodiment of the method, the step of obtaining the models further comprises determining a plane of best focus of an aerial image formed by the illumination source and the portion of the design layout optimized using the three-dimensional mask model.

In an embodiment of the method, the step of optimizing the illumination source and the portion of the design layout comprises using a cost function that represents at least one stochastic variation.

In an embodiment of the method, the step of obtaining the models further comprises mapping the freeform source to a discrete source.

In an embodiment of the method, the step of obtaining the models further comprises optimizing the portion of the design layout and the discrete source.

In an embodiment of the method, the step of obtaining the models further comprises optimizing the projection optics.

In an embodiment of the method, the step of obtaining the source shape and the mask defocus value comprises obtaining an initial value of mask defocus.

In an embodiment of the method, the step of obtaining the source shape and the mask defocus value further comprises optimizing the illumination source and the portion of the design layout using a thin mask model, wherein the illumination source is a freeform source.

In an embodiment of the method, the step of obtaining the source shape and the mask defocus value further comprises optimizing the mask defocus by using a three-dimensional mask model.

In an embodiment of the method, the step of obtaining the source shape and the mask defocus value comprises determining a plurality of mask defocus values using a plurality of pupil profiles.

In an embodiment of the method, the step of obtaining the source shape and the mask defocus value comprises averaging the several mask defocus values.

In an embodiment of the method, the step of obtaining the source shape and the mask defocus value comprises determining a plane of best focus of an aerial image formed by the illumination source, the portion of the design layout and the projection optics.

A computer program product comprising a non-transitory computer readable medium having instructions recorded thereon, the instructions when executed by a computer implementing the method of any of the above embodiments.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
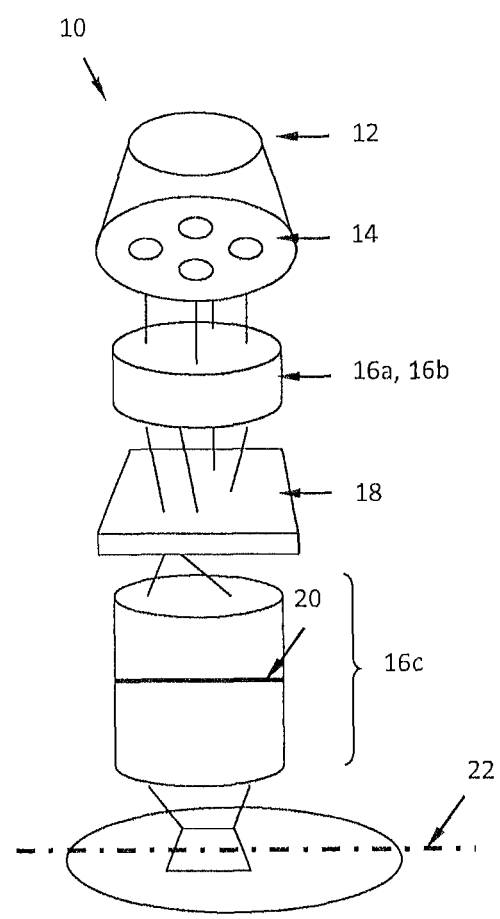
FIG. 1 is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results. As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as $\gamma$ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et, al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No, PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprise design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
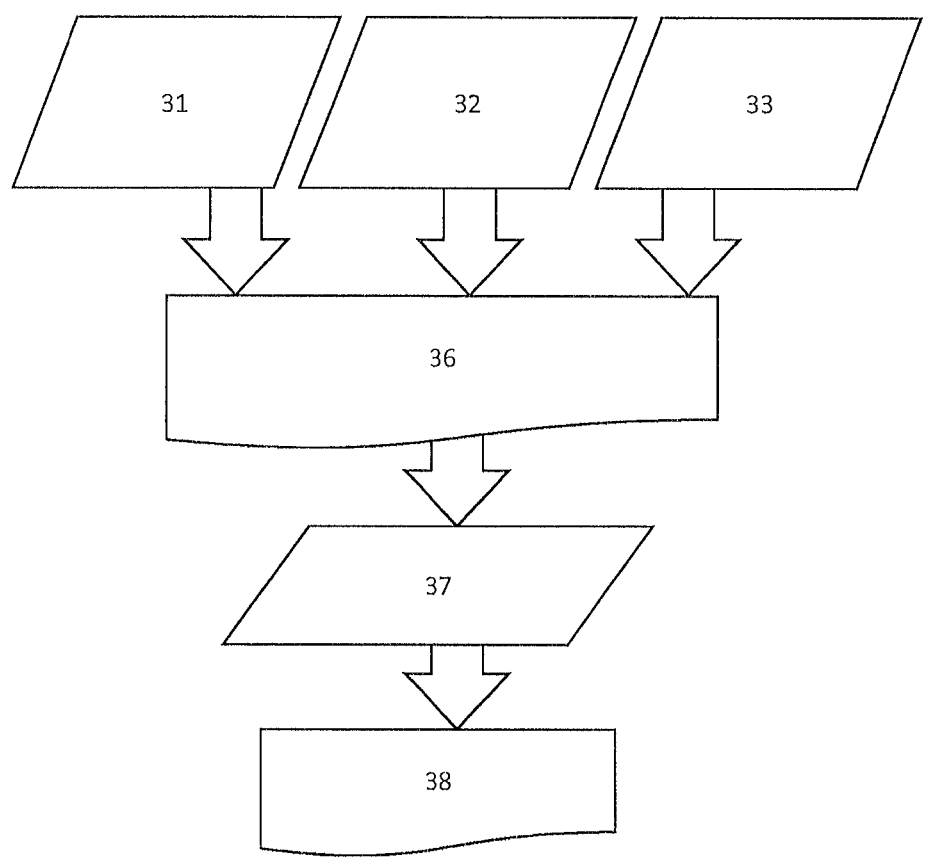
FIG. 2 is a block diagram of simulation models corresponding to the subsystems in FIG. 2.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

In one or more embodiments, optimization can be performed using a cost function, such as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a design layout, or resist image, or aerial image.

The cost function may represent any suitable characteristics of the lithographic projection apparatus or the substrate, for instance, focus, CD, image shift, image distortion, image rotation, etc. For example, the cost function may be a function of one or more of the following lithographic metrics: edge placement error, critical dimension, resist contour distance, worst defect size, stochastic effect, three-dimensional effect of the patterning device, three-dimensional effect of the resist, best focus shift, pupil fill factor, exposure time, and throughput. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called a "wavefront manipulator" that can be used to adjust shapes of a wavefront and intensity distribution and/or phase shift of the irradiation beam. The projection optics can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, and/or thermal expansion of components of the lithographic projection apparatus. Adjusting the wavefront and intensity distribution can change values of the evaluation points and the cost function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $CF(z_1, z_2, \ldots, z_N) = \sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

Further, if the PW (Process Window) is maximized, it is possible to consider the same physical location from different PW conditions as different evaluation points in the cost function in (Eq. 1). For example, if N PW conditions are considered, then the evaluation points can be categorized according to their PW conditions and the cost functions can be written as:

$$CF(z_1, z_2, \ldots, z_N) = \sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z_N) \quad \text{(Eq. 1')}$$

where $f_{p_u}(z_1, z_2, \ldots, z_N)$ is a function of the difference between an actual value and an intended value of the $p_i$-th evaluation point for a set of values of the design variables of $(z_1, z_2, \ldots, z_N)$ under the u-th PW condition $u=1, \ldots, U$. When this difference is the edge placement error (EPE), then minimizing the above cost function is equivalent to minimizing the edge shift under various PW conditions, thus this leads to maximizing the PW. In particular, if the PW also consists of different patterning device bias, then minimizing the above cost function also includes the minimization of MEEF (Mask Error Enhancement Factor), which is defined as the ratio between the wafer EPE and the induced mask edge bias.

The design variables may have constraints, which can be expressed as $(z_1, z_2, \ldots, z_N) \in Z$, where Z is a set of possible values of the design variables. The constraints may represent physical restrictions in a hardware implementation of the lithographic projection apparatus. The constraints may include one or more of: tuning ranges, rules governing patterning device manufacturability, and interdependence between the design variables.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) = \arg\min_{(z_1, z_2, \ldots, z_N) \in Z} \sum_{p=1}^{P} w_p f_p^2(z_1, z_2, \ldots, z_N) \quad \text{(Eq. 2)}$$

Figure 3:
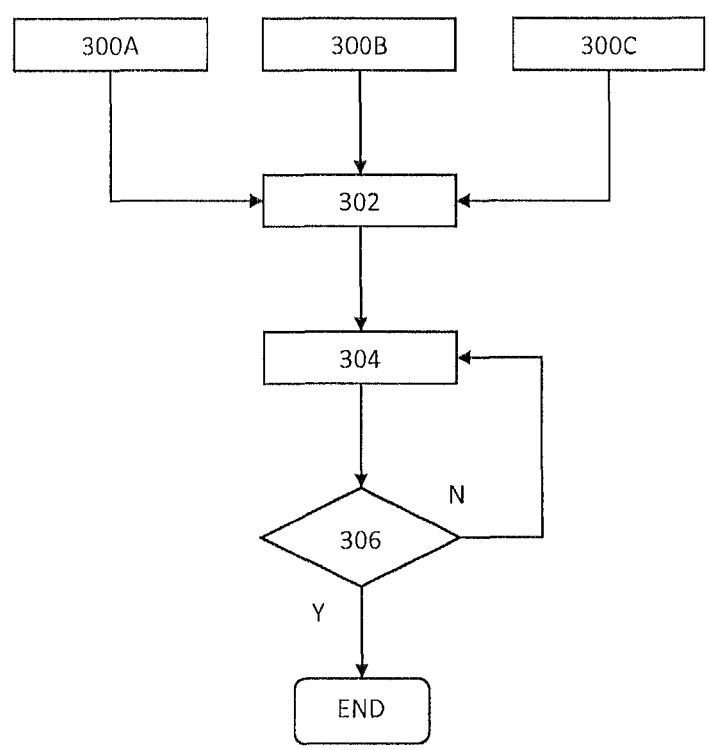
FIG. 3 shows a flow chart of a general method of optimizing the lithography projection apparatus.

A general method of optimizing the lithography projection apparatus, according to an embodiment, is illustrated in FIG. 3. This method comprises a step 302 of defining a multi-variable cost function of a plurality of design variables. The design variables may comprise any suitable combination selected from characteristics of the illumination source (300A) (e.g., pupil fill ratio, namely percentage of radiation of the source that passes through a pupil or aperture), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to an SMO. Alternatively, the design variables may include characteristics of the illumination source (300A), characteristics of the projection optics (300B) and characteristics of the design layout (300C), which leads to a source-mask-lens optimization (SMLO). In step 304, the design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step 306 is satisfied, the method ends. If none of the conditions in step 306 is satisfied, the step 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In another embodiment, instead of, or in addition to, calculating and/or determining the effect on the optical characteristics of the projection optics, it is envisioned that adjustable optical characteristics of the projection optics can be included in the design variables. Exemplary adjustable optical characteristics may include as lens manipulators, the temperature data or signal associated with the temperature data of one or more devices, e.g. heaters, utilized to control the temperature of an optical element of the projection system, Zernike coefficients. The SMO procedure can then be carried out and the design variables, including the adjustable optical characteristics, can be simultaneously adjusted so that the cost function is moved towards convergence.

Figure 4:
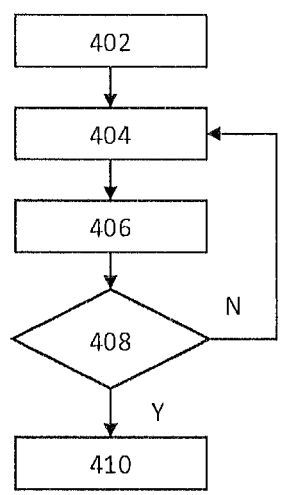
FIG. 4 shows a flow chart of a method of optimizing the lithography projection apparatus where the optimization of all the design variables is executed alternately.

In FIG. 3, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the source, patterning device, projection optics and/or any other design variables, are allowed to change at the same time. Alternatively, the optimization of all the design variables is executed alternately, as illustrated in FIG. 4. In this flow, in each step, some design variables are fixed while the other design variables are optimized to minimize the cost function; then in the next step, a different set of variables are fixed while the others are optimized to minimize the cost function. These steps are executed alternately until convergence or certain terminating conditions are met. As shown in the non-limiting example flowchart of FIG. 4, first, a design layout (step 402) is obtained, then a step of source optimization is executed in step 404, where all the design variables of the illumination source are optimized (SO) to minimize the cost function while all the other design variables are fixed. Then in the next step 406, a mask optimization (MO) is performed, where all the design variables of the patterning device are optimized to minimize the cost function while all the other design variables are fixed. These two steps are executed alternately, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternate-Optimization is used as an example for the alternative flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 5:
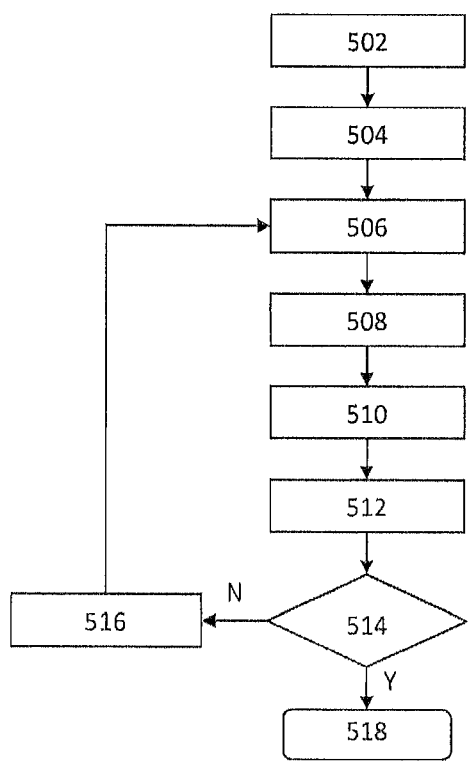
FIG. 5 shows one exemplary method of optimization, where a cost function is minimized.

FIG. 5 shows one exemplary method of optimization, where a cost function is minimized. In step 502, initial values of design variables are obtained, including their tuning ranges, if any. In step 504, the multi-variable cost function is set up. In step 506, the cost function is expanded within a small enough neighborhood around the starting point value of the design variables for the first iterative step (i=0). In step 508, standard multi-variable optimization techniques are applied to minimize the cost function. Note that the optimization can have constraints, such as tuning ranges, during the optimization process in 508 or at a later stage in the optimization process. Each iteration is done for the given test patterns (also known as "gauges") for the identified evaluation points that have been selected to optimize the lithographic process. In step 510, a lithographic response (e.g., certain characteristics of the aerial image, resist image, or certain characteristics of the lithographic process such as the process window) is predicted. In step 512, the result of step 510 is compared with a desired or ideal lithographic response value. If the termination condition is satisfied in step 514, i.e. the optimization generates a lithographic response value sufficiently close to the desired value, and then the final value of the design variables is outputted in step 518. The output step may also include outputting other functions using the final values of the design variables, such as outputting a wavefront aberration-adjusted map at the pupil plane (or other planes), an optimized source map, and optimized design layout etc. If the termination condition is not satisfied, then in step 516, the values of the design variables is updated with the result of the i-th iteration, and the process goes back to step 506. The process of FIG. 5 is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g., first order derivatives $$\frac{\partial f_p(z_1, z_2, \ldots, z_N)}{\partial z_n},$$

(n=1, 2, . . . N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$, does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} (z_n = z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \qquad \text{(Eq. 4)}$$

$$\sum_{p=1}^{P} w_p \left( \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} (z_n - z_{ni}) \right)^2$$

which is a quadratic function of the design variables ($z_1$, $z_2$, ..., $z_N$). Every term is constant except the design variables ($z_1$, $z_2$, ..., $z_N$).

If the design variables ($z_1$, $z_2$, ..., $z_N$) are not under any constraints, ($z_{1(i+1)}$, $z_{2(i+1)}$, ..., $z_{N(i+1)}$) can be derived by solving by N linear equations:

$$\frac{\partial CF(z_1, z_2, \ldots, z_N)}{\partial z_n} = 0,$$

wherein n=1, 2, ..., N.

If the design variables ($z_1$, $z_2$, ..., $z_N$) are under the constraints in the form of J inequalities (e.g. tuning ranges of ($z_1$, $z_2$, ..., $z_N$)) $\sum_{n=1}^{N} A_{nj} z_n \leq B_j$, for j=1, 2, ..., J; and K equalities (e.g. interdependence between the design variables) $\sum_{n=1}^{N} C_{nk} z_n \leq D_k$, for k=1, 2, ..., K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$, can be introduced to limit the difference between ($z_{1(i+1)}$, $z_{2(i+1)}$, ..., $z_{N(i+1)}$) and ($z_{1i}$, $z_{2i}$, ..., $z_{Ni}$), so that the approximation of Eq. 3 holds. Such constraints can be expressed as $z_{ni} - \Delta_D \leq z_n \leq z_{ni} + \Delta_D$. ($z_{1(i+1)}$, $z_{2(i+1)}$, ..., $z_{N(i+1)}$) can be derived using, for example, methods described in Numerical Optimization (2$^{nd}$ ed.) by Jorge Nocedal and Stephen J. Wright (Berlin N.Y.: Vandenberghe, Cambridge University Press).

Instead of minimizing the RMS of $f(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \qquad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q, \qquad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$, are two constants specifying the minimum and maximum allowed deviation for the $f_p(z_1, z_2, \ldots, z_N)$. Plugging Eq. 3 in, these constraints are transformed to, for p=1, ... P, $$\sum_{n=1}^{N} \frac{\partial f_p(z_1, z_2, \ldots, z_N)}{\partial z_n} \bigg|_{z_1=z_{1i}, z_2=z_{2i}, \ldots z_n=z_{Ni}} \qquad \text{(Eq. 6')}$$

$$z_n \leq E_{Up} + \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} - f_p(z_{1i}, z_{2i}, \ldots, z_{Ni}) \text{ and}$$

$$-\sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}} \qquad \text{(Eq. 6'')}$$

$$z_n \leq -E_{Up} - \sum_{n=1}^{N} \frac{\partial f_p(z_1, z_2, \ldots, z_N)}{\partial z_n} \bigg|_{z_1=z_{1i}, z_2=z_{2i}, \ldots z_N=z_{Ni}}$$

$$z_{ni} + f_p(z_{1i}, z_{2i}, \ldots, z_{Ni})$$

Since Eq. 3 is generally valid only in the vicinity of ($z_1$, $z_2$, ..., $z_N$), in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_1$, $z_2$, ..., $z_N$), i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = \qquad \text{(Eq. 6''')}$$

$$(1-\lambda) \sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq.4 and the RMS of the defect size is only minimized; while if $\lambda=1$, then this becomes Eq.5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \max_{(f, \varepsilon) = (f_0 \pm \Delta f, \varepsilon_0 \pm \varepsilon)} \max_p |f_p(z_1, z_2, \ldots, z_N, f, \varepsilon)| \quad \text{(Eq. 27)}.$$

or $$CF(z_1, z_2, \ldots, z_N, f_0, \varepsilon_0) = \Sigma_{(f, \varepsilon) = (f_0 \pm \Delta f, \varepsilon_0 \pm \varepsilon)} \Sigma_p w_p f_p^2 (z_1, z_2, \ldots, z_N, f, \varepsilon) \quad \text{(Eq. 27')}$$

or $$CF(z_1, z_2, \ldots, z_N, f_0, \varepsilon_0) = (1-\lambda)\Sigma_{(f, \varepsilon) = (f_0 \pm \Delta f, \varepsilon_0 \pm \varepsilon)} \Sigma_p w_p f_p^2 (z_1, z_2, \ldots, z_N, f, \varepsilon) + \lambda \max_{(f, \varepsilon) = (f_0 \pm \Delta f, \varepsilon_0 \pm \varepsilon)} \max_p |f_p (z_1, z_2, \ldots, z_N, f, \varepsilon)| \quad \text{(Eq.27")}$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

Figure 9:
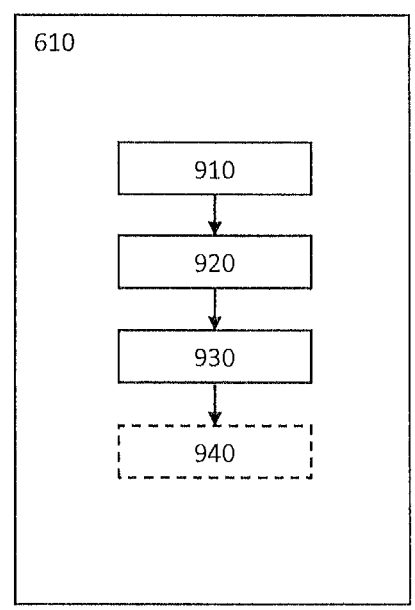
FIG. 9 shows details of step 610, according to an embodiment.

The methods described earlier in this disclosure can be used to minimize the respective cost functions of Eqs. 27, 27', or 27". If the design variables are characteristics of the projection optics, such as the Zernike coefficients, then minimizing the cost functions of Eqs. 27, 27', or 27" leads to process window maximization based on projection optics optimization, i.e., LO. If the design variables are characteristics of the source and patterning device in addition to those of the projection optics, then minimizing the cost function of Eqs. 27, 27', or 27" leads to process window maximizing based on SMLO, as illustrated in FIG. 9. If the design variables are characteristics of the source and patterning device and, then minimizing the cost functions of Eqs. 27, 27', or 27" leads to process window maximization based on SMO.

The optimization described above may be used to find a set of values of $(z_1, z_2, \ldots, z_N)$ to reduce many physical effects that may be adverse to the lithographic process. Multiple optimizations may be conducted in series for different physical effects, on different components of the lithographic apparatus, and under different conditions. Some of the effects, components, and conditions may be unique in lithography using EUV. For example, in an EUV lithographic projection apparatus, the projection optics may not be telecentric because the projection optics include one or more reflective optical components. A non-telecentric optical system can exhibit varying magnification for objects at different distances and lead to pattern shift. For example, an EUV lithographic projection apparatus may have oblique chief rays incident on the pattern device, which may lead to shadowing and pattern shift. The pattern shift may be pattern-dependent and/or slit position-dependent. For example, the source in an EUV lithographic projection apparatus may be a discrete source (e.g., rendered by an array of mirrors having discrete reflective states). The differences between an EUV lithographic projection apparatus and a DUV lithographic projection apparatus call for a new flow of optimizations. Of course, the flows disclosed herein are not limited to use in an EUV lithographic projection apparatus. The new flow of optimization preferably mitigates the H-V bias, Bossung tilt, and pattern shift due to shadowing and non-telecentricity and reduces the sensitivity to flare.

Figure 6:
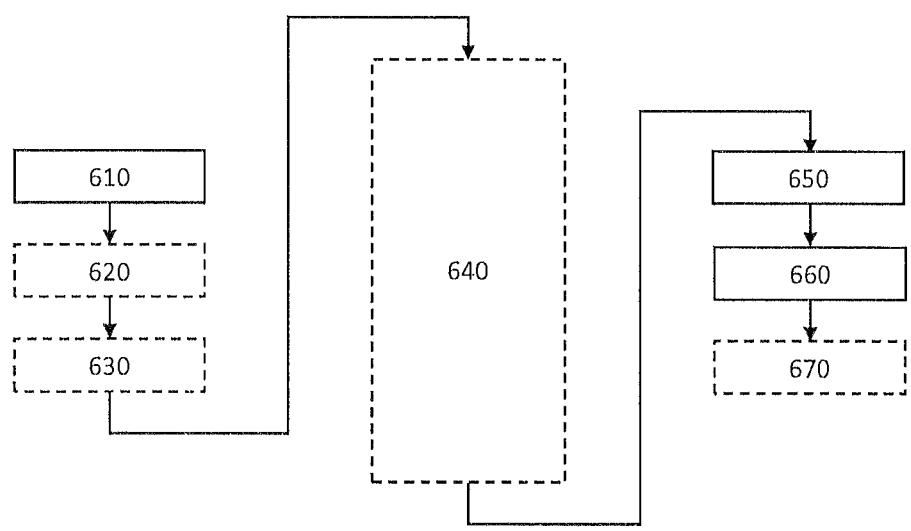
FIG. 6 shows a flow of optimizations according to an embodiment.

FIG. 6 shows a flow of optimizations according to an embodiment. The flow starts with a step 610 of obtaining a source shape (which may be represented by an intensity and/or phase distribution at a plane below the source, such as the pupil plane) and a mask defocus value (a global shift of the patterning device along the optical axis of the projection optics). The source shape and mask defocus value may be selected or measured using any suitable method, such as those illustrated in FIG. 8 and FIG. 9.

In optional step 620, the design layout is optimized as a continuous transmission mask ("CTM optimization"). In this optimization, the transmission at all the locations of the design layout is not restricted to a number of discrete values. Instead, the transmission may assume any value within an upper bound and a lower bound. More details may be found in commonly assigned U.S. Pat. No. 8,584,056, the disclosure of which is hereby incorporated by reference in its entirety. A continuous transmission mask is very difficult, if not impossible, to implement on the patterning device. However, it is a useful tool because not restricting the transmission to a number of discrete values makes the optimization much faster. In an EUV lithographic projection apparatus, the patterning device may be reflective. The principle of CTM optimization is also applicable to a design layout to be produced on a reflective patterning device, where the reflectivity at all the locations of the design layout is not restricted to a number of discrete values. Therefore, as used herein, the term "continuous transmission mask" may refer to a design layout to be produced on a reflective patterning device or a transmissive patterning device. The CTM optimization may be based on a three-dimensional mask model that takes in account thick-mask effects. The thick-mask effects arise from the vector nature of light and may be significant when feature sizes on the design layout are smaller than the wavelength of light used in the lithographic process. The thick-mask effects include polarization dependence due to the different boundary conditions for the electric and magnetic fields, transmission, reflectance and phase error in small openings, edge diffraction (or scattering) effects or electromagnetic coupling. More details of a three-dimensional mask model may be found in commonly assigned U.S. Pat. No. 7,703,069, the disclosure of which is hereby incorporated by reference in its entirety.

In optional step 630, assist features (sub resolution assist features and/or printable resolution assist features) may be placed into the design layout based on the design layout optimized as a continuous transmission mask in step 620. This step allows identification and design of the assist feature from the continuous transmission mask.

In optional step 640, a model of the source, the design layout and the projection optics is obtained. This step will be explained in further details. Preferably, the model can calculate an aerial image by using the Hopkins's formula. The Hopkin's formula uses a transmission function of the source and the projection optics. The transmission function may be expanded into Zernike polynomials. The model is used to simulate the lithographic process. For example, the model may be used to simulate an aerial image produced by the source, the design layout and the projection optics. The model may include sub-models for the source, the design layout and the projection optics, respectively.

In step 650, the dose of the lithographic process may be optimized by using the model obtained in optional step 640.

In step 660, the design layout may be optimized for each of a number of slit positions of the source. In an EUV lithographic apparatus, the through slit aberration tends to vary with the slit positions. The slit aberration may be due to many effects such as substrate defocus, dose drift, mask dimension change, heating, etc. This step allows compensation for the slit aberration. For example, a cost function that measures evaluation points under the slit positions may be used in this step.

In optional step 670, a process window is determined for each of the slit positions.

Figure 7A:
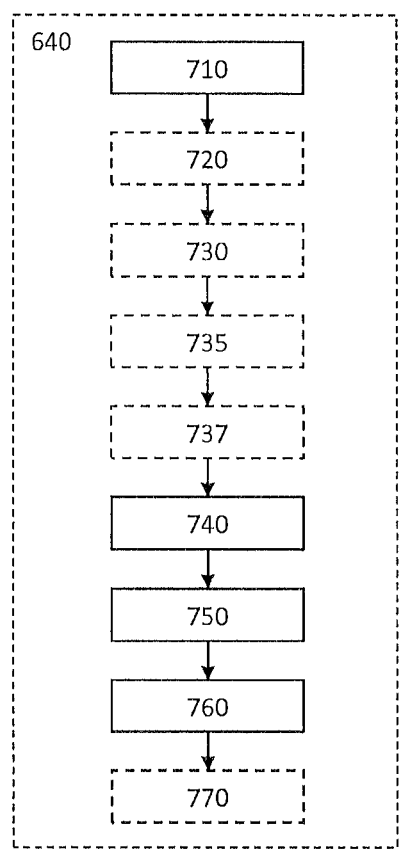
FIG. 7A shows details of step 640, according to an embodiment.

FIG. 7A shows details of step 640, according to an embodiment. In step 710, under the assumption that the source is a freeform source, the source and the design layout may be optimized using a three-dimensional mask model. A freeform source means that the intensity at the pupil plane is not limited to a number of discrete values. Assuming that the source is a freeform source makes this optimization much faster. A three-dimensional mask model takes in account thick-mask effects. The thick-mask effects arise from the vector nature of light and may be significant when feature sizes on the design layout are smaller than the wavelength of light used in the lithographic process. The thick-mask effects include polarization dependence due to the different boundary conditions for the electric and magnetic fields, transmission, reflectance and phase error in small openings, edge diffraction (or scattering) effects or electromagnetic coupling. More details of a three-dimensional mask model may be found in commonly assigned U.S. Pat. No. 7,703,069, the disclosure of which is hereby incorporated by reference in its entirety.

In optional step 720, the mask defocus is optimized using the source and design layout optimized in step 710. This step allows adjustment of the mask defocus to accommodate changes to the source and design layout caused by the optimization in step 710. For example, the mask defocus can be a design variable. A cost function may be minimized to find the mask defocus.

In optional step 730, a plane of best focus of the aerial image formed by the source and the patterning device as optimized in step 710 is determined. For example, the best focus can be a design variable. A cost function may be minimized to find the best focus.

In optional step 735, the dose and focus may be optimized for the source and design layout optimized in step 710.

In optional step 737, under the assumption that the source is a freeform source, the source and the design layout may be optimized using a three-dimensional mask model, with at least one stochastic effect taken into account.

In a lithographic projection apparatus, for example, using an EUV (extreme ultra-violet radiation, e.g. having a wavelength in the range 5-20 nm) source or a non-EUV source with reduced radiation intensity (or reduced photon counts) may lead to stronger stochastic variations, such as pronounced line width roughness and local CD variation in small two-dimensional features such as holes. In a lithographic projection apparatus using an EUV source, reduced radiation intensity (or reduced photon counts) is attributed to low total radiation output from the source (or high energy of EUV photons), radiation loss from optics that shape the radiation from the source, transmission loss through the projection optics, high photon energy that leads to fewer photons under a constant dose, etc. The stochastic variations may be attributed to factors such as photon shot noise, photon-generated secondary electrons, photon absorption variation, photon-generated acids in the resist. The small sizes of features for which EUV is called for further compound these stochastic variations. The stochastic variations in smaller features are a significant factor in production yield and justifies inclusion in a variety of optimization processes of the lithographic projection apparatus.

Under the same radiation intensity, lower exposure time of each substrate leads to higher throughput of a lithographic projection apparatus but stronger stochastic variation. The photon shot noise in a given feature under a given radiation intensity is proportional to the square root of the exposure time. The desire to lower exposure time for the purpose of increasing the throughput exists in lithography using EUV and other radiation sources.

The throughput can also be affected by the total amount of light directed to the substrate. In some lithographic projection apparatuses, a portion of the light from the source is sacrificed in order to achieve desired shapes of the source.

A stochastic variation such as line edge roughness is usually represented by a parameter of the distribution of the underlying characteristic. One example of stochastic variations is the line edge roughness (LER). LER may be represented by 3σ of the spatial distribution of an edge of a feature, assuming the distribution is a normal distribution. The 3σ may be derived from the locations of the edge of the feature in many exposures or simulations of the edge. One example of stochastic variations is line width roughness (LWR). The LWR may be a 3σ of the distribution of the width of a 1D feature (e.g., a long line), assuming the distribution is a normal distribution. The LWR of a 1D feature may be derived from the width of a 1D feature in many exposures or simulations of the width. Another example of stochastic variations is the local CD uniformity (LCDU). LCDU may be a 3σ of the distribution (assuming the distribution is a normal distribution) of the CD of a 2D feature in many exposures or simulations of the CD. Other examples of stochastic variations may include contact-edge roughness (CER), wagon-wheel LCDU, etc.

Figure 7B:
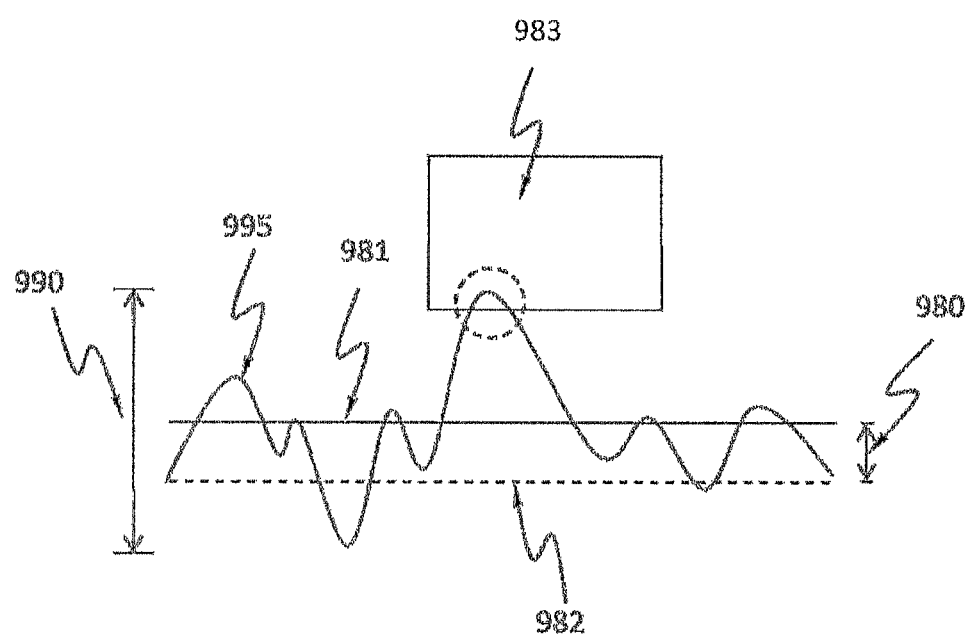
FIG. 7B schematically illustrates deviation caused by a stochastic effect and deviation caused by non-stochastic effects.

A stochastic variation may be used as a measure of the likelihood of a deviation caused by a stochastic effect in a characteristic of an aerial image or a resist image. FIG. 7B schematically illustrates deviation caused by a stochastic effect and deviation caused by non-stochastic effects. In the example in FIG. 7B, an intended position of an edge of a feature in an aerial image or resist image is indicated as the dotted line 982. The actual edge is indicated as the curve 995, which includes both a stochastic variation (LER in this example) and an error (e.g., caused by other factors such as dose variation, focus variation, source shape, mask errors, etc.) unrelated to stochastic effect. The average location of the actual edge is indicated as the solid line 981. The difference 980 between the average location (the solid line 981) and the intended location (the dotted line 982) is the error unrelated to stochastic effect, which may be referred to as an edge placement error (EPE). The variation of the actual edge relative to the average location is the stochastic variation. The band 990 around the average location (the solid line 981) that encloses the stochastic variation may be called a stochastic variation band, which represents the extent the actual edge may reach due to a stochastic effect. The width of the stochastic variation band may be greater than the EPE. Therefore, the total possible deviation from the intended location (the dotted line 982) of the edge may be a sum of the EPE and the stochastic variation band. If there were no stochastic variation, the actual location of the edge in this example would be at the location indicated by the solid line 981, which does not merge with a neighboring feature 983 and thus does not produce a defect. However, when a stochastic variation is present and the stochastic variation band is large enough (e.g., the band 990), the actual edge may merge (where marked by the dotted circle) with the neighboring feature 983 and thus produces a defect.

The source and the design layout may be optimized in step 737 using a cost function that represents at least one stochastic variation such as the LWR, LER, LCDU. In an example, the cost function may have the form of Eq. 1. At least one $f_p(z_1, z_2, \ldots, z_N)$ may be an explicit function of a stochastic variation, such as $f_p(\text{LER})=\text{LER}^2(z_1, z_2, \ldots, z_N)$. $f_p(z_1, z_2, \ldots, z_N)$ may be an explicit function of a variable that is a function of a stochastic variation such as LER. For example, blurred image log scope (bl_ILS) may be a function of LER and $$f_p(\text{bl\_ILS}(LER)) = f_p\left(b\sqrt{\frac{LER}{a \times (\text{dose} \times \text{image intensity})^c}}\right).$$

$f_p(z_1, z_2, \ldots, z_N)$ may be a variable that affects a stochastic variation such as LER. Optimization using a cost function that represents a stochastic variation may lead to values of the design variables that reduce or minimize the stochastic variation. The cost function may represent any suitable characteristics of the lithographic projection apparatus or the substrate, for instance, focus, CD, image shift, image distortion, image rotation, stochastic variations, throughput, LCDU, or a combination thereof. In one embodiment, the cost function represents (i.e., is a function of) LCDU, throughput, and the stochastic variations. In one embodiment, the cost function represents (e.g., includes a $f_p(z_1, z_2, \ldots, z_N)$ that is a function of) EPE, throughput, and the stochastic variations. In one embodiment, the cost function includes a $f_p(z_1, z_2, \ldots, z_N)$ that is a function of EPE and a $f_p(z_1, z_2, \ldots, z_N)$ that is a function of a stochastic variation such as LER. One example of a cost function that represents a stochastic variation may have the form $CF(z_1, z_2, \ldots, z_N)=\Sigma_{p=1}^{P} w_p \text{EPE}_p^2(z_1, z_2, \ldots, z_N)+s\cdot\text{LER}^2$. This is because EPE and LER both have a dimension of length. Therefore, they can be directly added. Another example of a cost function that represents a stochastic variation may have the form $$CF(z_1, z_2, \ldots, z_N) = \sum_{p=1}^{P}\left(w_p EPE_p^2(z_1, z_2, \ldots, z_N) + s_p\left(\frac{\delta}{ILS(x_e(0))}\right)^2\right).$$

According to an embodiment, the SEPE term $$s_p\left(\frac{\delta}{ILS(x_e(0))}\right)^2$$

can be turned on only when $|\text{EPE}_p|$ is above an user-selected offset, so that the SEPE turn does not dominate the EPE term $\text{EPE}_p^2$. The cost function thus can be written as $$CF(z_1, z_2, \ldots, z_N) = \sum_{p=1}^{P}\left(w_p EPE_p^2(z_1, z_2, \ldots, z_N) + s_p\left(\frac{\delta}{ILS(x_e(0))}\right)^2\right),$$

where $s_p=0$ when $|\text{EPE}_p|\leq\text{OF}$ and $s_p\neq0$ when $|\text{EPE}_p|>\text{OF}$; OF is the offset.

In step 740, the freeform source is mapped to a discrete source. The freeform source is not directly renderable with certain hardware. An initial discrete pupil profile resembling the pupil profile of the freeform source and renderable by hardware of the source (e.g., renderable by the array of mirrors) is calculated using any suitable method based on the pupil profile of the freeform source.

In step 750, the dose of the lithographic process may be optimized. This step allows compensation for dose change due to the mapping of the freeform source to the discrete source.

Traditional technology uses glass discs called diffractive optical elements (DOEs) to shape the light from the source. For complex pupil profiles, these DOEs have to be custom designed and manufactured. Applicant's FlexRay™ source uses a programmable array of individually adjustable mirrors. It can create any pupil profile in a matter of minutes-eliminating the long cycle time associated with DOE design and fabrication and thus accelerating ramp to yield for low $k_1$ designs. Although the number of the adjustable mirrors may be as large as several hundred, they are still spatially discrete. In some lithographic projection systems, the mirrors are not continuously adjustable-namely each mirror can be in several (e.g., 2-6) discrete states. Due to the discrete nature of the mirrors, the pupil profile actually rendered using the array of mirrors resembles but may still substantially deviate from the pupil profile of the freeform source. This deviation tends to be greater in an EUV source. This deviation may be reduced if the discrete nature of the mirrors is taken into account when the source is optimized. However, traditional discrete optimization (e.g., branch-andbound algorithm) is computational costly (with run time increasing exponentially with the number of mirrors), namely $O(\alpha^n)$, wherein $\alpha$ is constant and n is the number of mirrors. In step 760, the design layout and the discrete source are optimized, according to a method that may reduce the computational cost to be proportional to the number of mirrors, namely $O(n)$. This method may include: selecting a discrete change to the current discrete pupil profile and applying the selected change to the current discrete pupil profile, where the current discrete pupil profile with the selected discrete change becomes the current discrete profile in the next iteration; optimizing, with the pupil profile fixed, design variables unassociated to source hardware (e.g., such source hardware may include the mirrors) that causes discrete change in discrete pupil profile (e.g., design variables associated with the patterning device, the dose, etc.), wherein these design variables could include discrete and/or continuous design variables; iterating these steps if no end condition is satisfied. More details may be found in commonly assigned U.S. Patent Application Ser. No. 61/769,015, the disclosure of which is hereby incorporated by reference in its entirety.

In optional step 770, the projection optics may be optimized. For example, the wavefront may be adjusted, by using, for example, Applicant's FlexWave™ projection optics. This step allows adjustment of the projection optics to accommodate the discrete source and the design layout optimized in step 760. For example, a cost function that are functions of design variables characterizing the projection optics may be used in this optimization.

Figure 8:
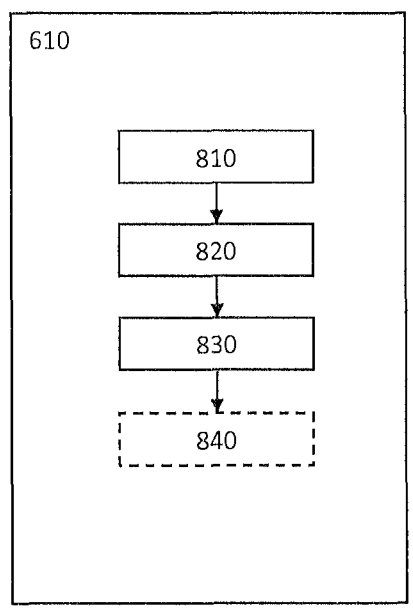
FIG. 8 shows details of step 610, according to an embodiment.

FIG. 8 shows details of step 610, according to an embodiment. In step 810, an initial value of the mask defocus and an initial source shape (e.g., a ring shape) is obtained. The mask defocus may be weakly dependent on the source. Therefore, the initial value of the mask defocus and the initial source shape need not be particularly selected. In step 820, under the assumption that the source is a freeform source, the source and the design layout may be optimized using a thin mask model. A thin mask model does not take in account thick-mask effects and thus faster than a three-dimensional mask model. In step 830, the dose of the lithographic process may be optimized with the thick-mask effects taking into account. This step allows compensation for changes in the dose from the thin mask model to the thick mask model. In optional step 840, the mask defocus is optimized for the optimized source in step 820, although the mask defocus may only weakly depend on the source. The method in FIG. 8 may be effective to reduce the thick-mask effects and pattern shift.

FIG. 9 shows details of step 610, according to an alternative embodiment. Compared to the method in FIG. 8, the method in FIG. 9 is computationally faster. The mask defocus may be weakly dependent on the source. Therefore, a method for obtaining the mask defocus may be based on averaging several mask defocus values determined using several pupil profiles (e.g., quasi-conventional, large annular, small annular, x-dipole, y-dipole, quasar, and c-quad). In step 910, an initial value of the mask defocus is obtained. In step 920, several mask defocus values are determined using several pupil profiles and the initial value of the mask defocus. In step 930, obtaining the mask defocus value of step 610 by averaging the several mask defocus values. In optional step 940, a plane of best focus of an aerial image formed by the illumination source, the portion of the design layout and the projection optics is determined.

Figure 10:
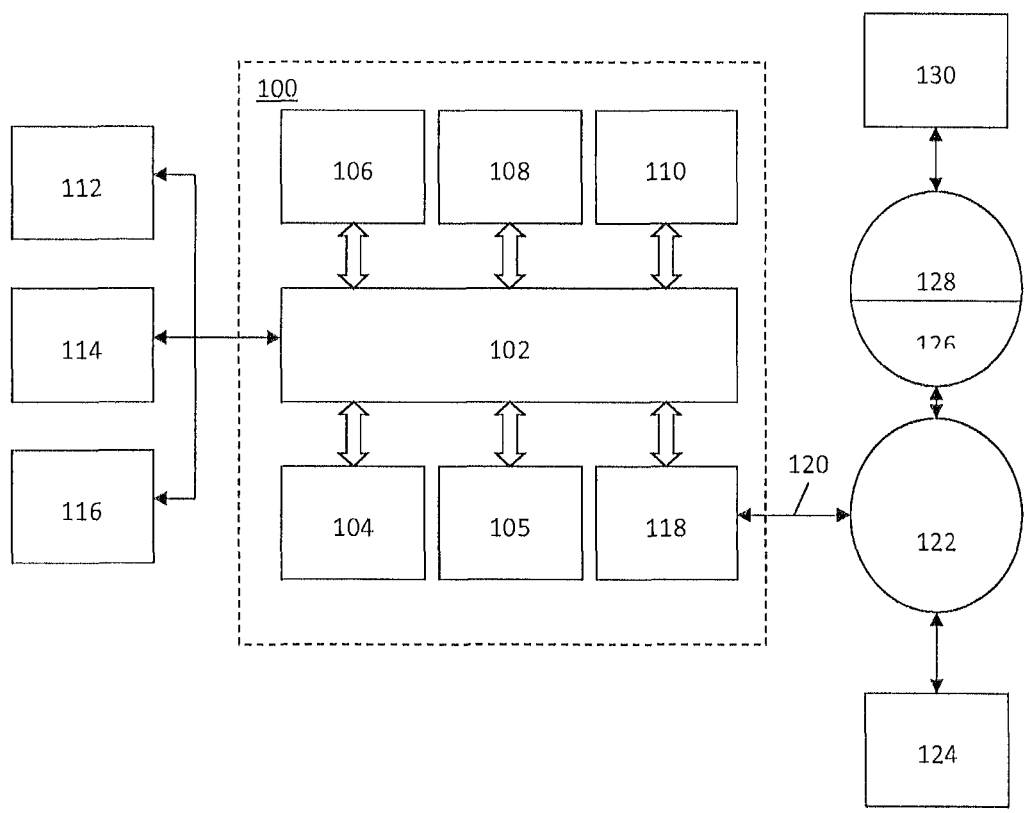
FIG. 10 is a block diagram of an example computer system in which embodiments can be implemented.

FIG. 10 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104, A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors ill a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 11:
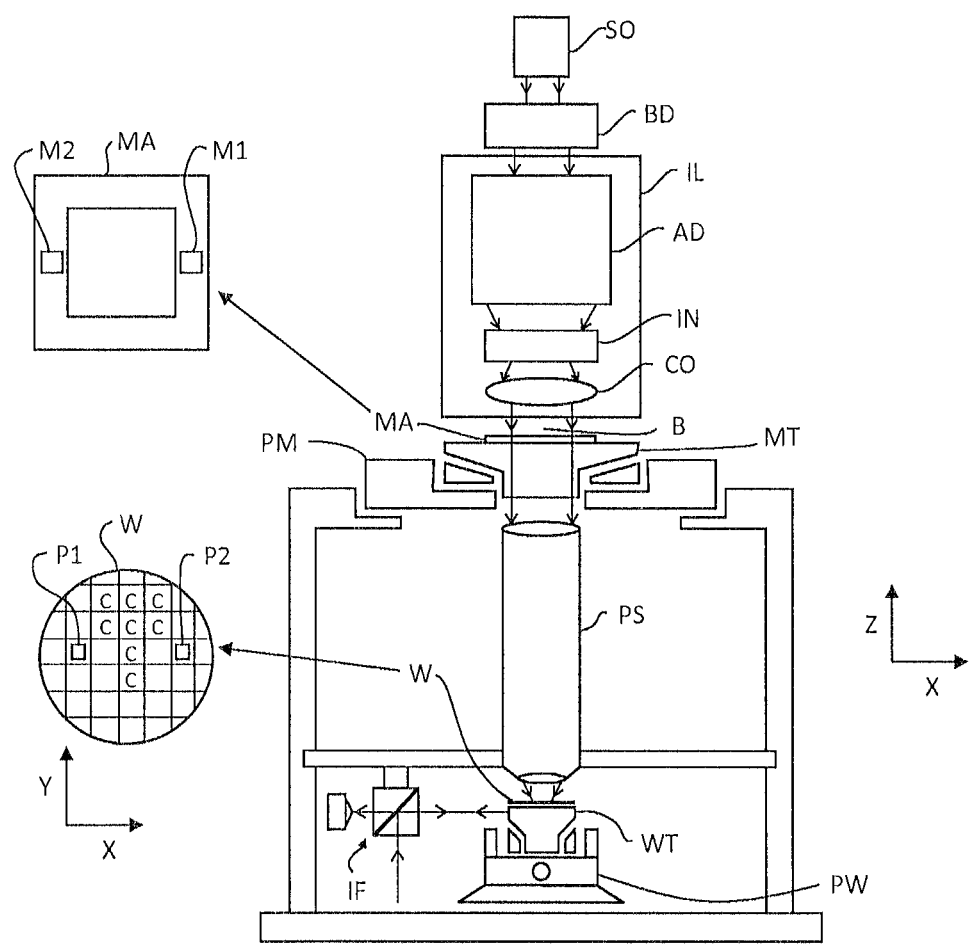
FIG. 11 is a schematic diagram of a lithographic projection apparatus to which embodiments are applicable.

FIG. 11 schematically depicts an exemplary lithographic projection apparatus whose illumination source could be optimized utilizing the methods described herein. The apparatus comprises:

- a radiation system IL, to supply a projection beam B of radiation. In this particular case, the radiation system also comprises a radiation source SO;
- a first object table (e.g., mask table) MT comprising a holder configured to hold a patterning device MA (e.g., a mask or a reticle), and connected to a first positioner to accurately position the patterning device with respect to item PS;
- a second object table (substrate table) WT comprising a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective patterning device). Alternatively, the apparatus may employ another kind of patterning device as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander Ex, for example. The illuminator IL may comprise an adjuster AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioner (and interferometric measuring device IF), the substrate table WT can be moved accurately, e.g. so as to position different target portions C in the path of the beam PB. Similarly, the first positioner can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash", Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 12:
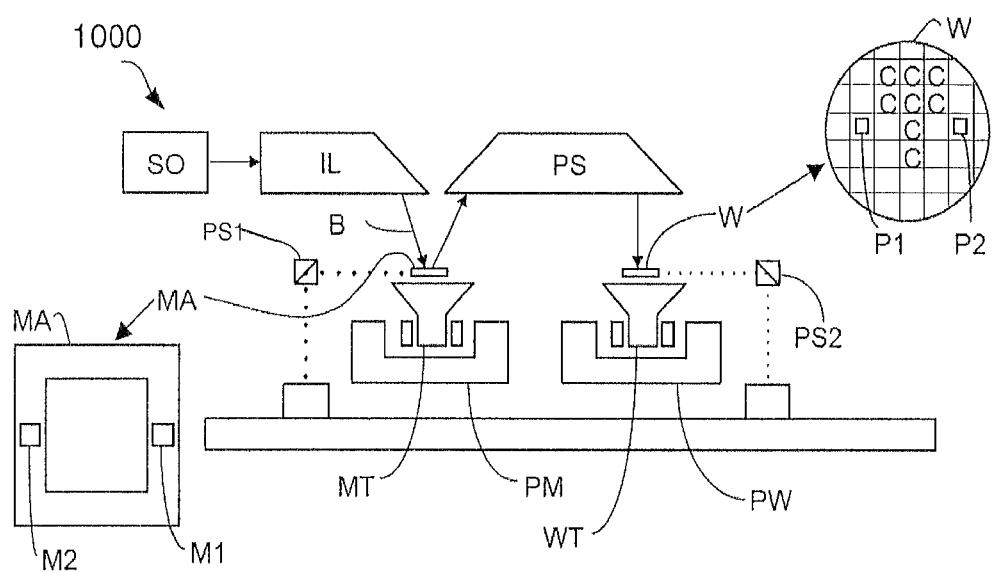
FIG. 12 is a schematic diagram of another lithographic projection apparatus.

FIG. 12 schematically depicts another exemplary lithographic projection apparatus 1000 whose illumination source could be optimized utilizing the methods described herein.

The lithographic projection apparatus 1000 includes:

a source collector module SO an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 12, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 12, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
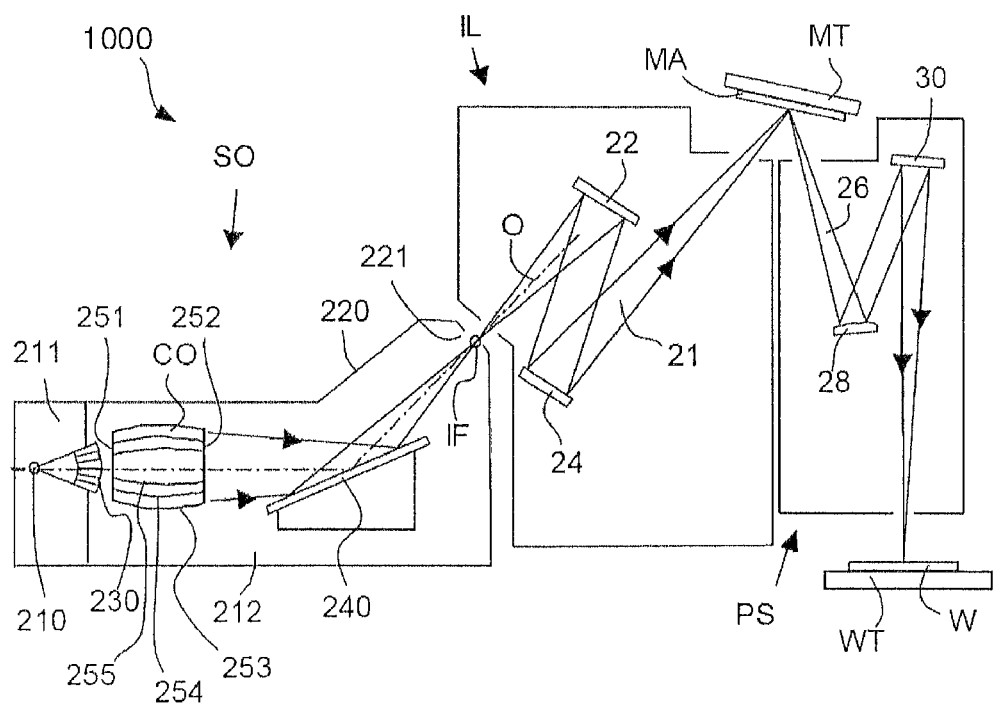
FIG. 13 is a more detailed view of the apparatus in FIG. 12.

FIG. 13 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O', The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Collector optic CO, as illustrated in FIG. 13, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 14:
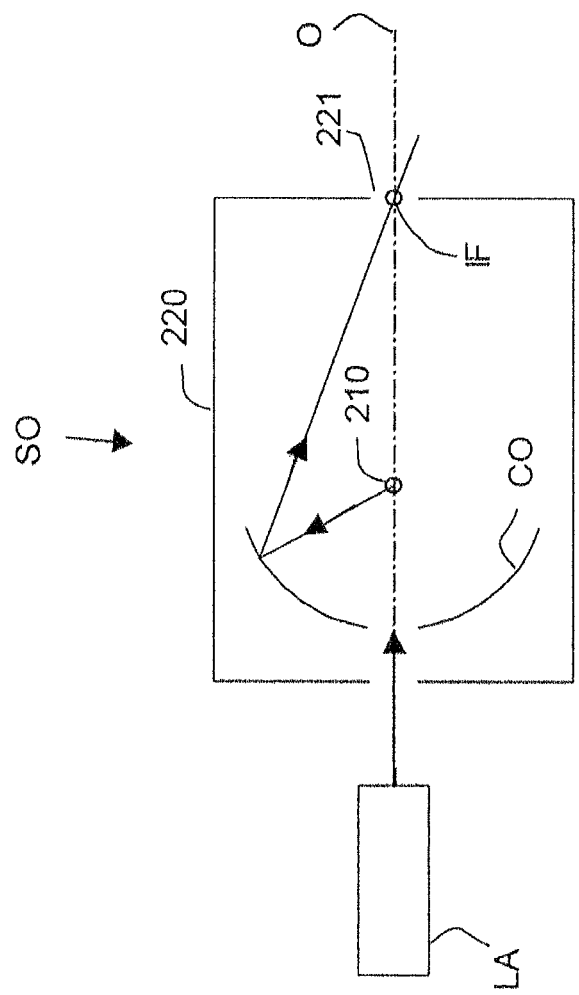
FIG. 14 is a more detailed view of the source collector module SO of the apparatus of FIG. 12 and FIG. 13.

Alternatively, the source collector module SO may be part of an LPP radiation system as shown in FIG. 14. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method to improve a lithographic process for imaging a portion of a design layout onto a substrate using a lithographic projection apparatus comprising an illumination source and projection optics, the method comprising:
    obtaining a source shape and a mask defocus value;
    optimizing a dose of the lithographic process;
    optimizing the portion of the design layout for each of a plurality of slit positions of the illumination source.
2. The method of clause 1, further comprising optimizing the design layout wherein transmission at all locations of the portion of the design layout is not restricted to a number of discrete values.
3. The method of any of clauses 1 to 2, further comprising placing one or more assist features into the portion of the design layout.
4. The method of clause 3, wherein the assist features comprise a sub resolution assist feature, a printable resolution assist feature, or a combination thereof.
5. The method of any of clauses 1 to 4, further comprising obtaining a model of the source, a model of the portion of the design layout, a model of the projection optics, or a combination thereof, wherein the models are configured to simulate an aerial image produced by the source, the portion of the design layout and the projection optics.
6. The method of clause 5, wherein the models are configured for calculating an aerial image by using the Abbe or Hopkins' formula.
7. The method of clause 5, wherein the step of optimizing the dose of the lithographic process comprises using at least one of the models.
8. The method of any of clauses 1 to 7, further comprising determining for each of the slit positions, a process window.
9. The method of any of clauses 5 to 7, wherein the step of obtaining the models comprises optimizing the illumination source and the portion of the design layout using a three-dimensional mask model, under an assumption that the illumination source is a freeform source.
10. The method of clause 9, wherein the step of obtaining the models further comprises determining a plane of best focus of an aerial image formed by the illumination source and the portion of the design layout optimized using the three-dimensional mask model.

11. The method of clause 9, wherein the step of optimizing the illumination source and the portion of the design layout comprises using a cost function that represents at least one stochastic variation.

12. The method of any of clauses 9 to 11, wherein the step of obtaining the models further comprises mapping the freeform source to a discrete source.

13. The method of any of clauses 9 to 12, wherein the step of obtaining the models further comprises optimizing the portion of the design layout and the discrete source.

14. The method of clause 9, wherein the step of obtaining the models further comprises optimizing the projection optics.

15. The method of any of clauses 1 to 14, wherein the step of obtaining the source shape and the mask defocus value comprises obtaining an initial value of mask defocus.

16. The method of clause 15, wherein the step of obtaining the source shape and the mask defocus value further comprises optimizing the illumination source and the portion of the design layout using a thin mask model, wherein the illumination source is a freeform source.

17. The method of clause 16, wherein the step of obtaining the source shape and the mask defocus value further comprises optimizing the mask defocus by using a three-dimensional mask model.

18. The method of clause 15, wherein the step of obtaining the source shape and the mask defocus value comprises determining a plurality of mask defocus values using a plurality of pupil profiles.

19. The method of any of clauses 15 and 18, wherein the step of obtaining the source shape and the mask defocus value comprises averaging the several mask defocus values.

20. The method of any of clauses 15, 18 and 19, wherein the step of obtaining the source shape and the mask defocus value comprises determining a plane of best focus of an aerial image formed by the illumination source, the portion of the design layout and the projection optics.

21. A computer program product comprising a non-transitory computer readable medium having instructions recorded thereon, the instructions when executed by a computer implementing the method of any of the above clauses.

22. A lithographic imaging apparatus configured for imaging the portion of a design layout onto a substrate using the source shape, the mask defocus value and the dose determined by the method of any of the clauses 1 to 20.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method to improve a lithographic process for imaging a portion of a design layout onto a substrate using a lithographic projection apparatus comprising an illumination system and projection optics, the method comprising:
    optimizing, by a hardware computer system, a patterning device defocus value of the lithographic process; and
    optimizing, by the hardware computer system performing a simulation and based on the patterning device defocus value, the portion of the design layout for each of a plurality of slit positions of an illumination for a patterning device.

2. The method of claim 1, further comprising optimizing the portion of the design layout wherein transmission at all locations of the portion of the design layout is not restricted to a number of discrete values.

3. The method of claim 1, further comprising determining, for each of the slit positions, a process window.

4. The method of claim 1, comprising optimizing the illumination and the portion of the design layout using a three-dimensional mask model, under an assumption that the illumination is a freeform illumination.

5. The method of claim 4, comprising determining a plane of best focus of an aerial image formed by the illumination and the portion of the design layout optimized using the three-dimensional mask model.

6. The method of claim 4, wherein the optimizing the illumination and the portion of the design layout comprises using a cost function that represents at least one stochastic variation.

7. The method of claim 1, comprising:
    mapping a freeform illumination to a discrete illumination, or
    optimizing the portion of the design layout and a discrete illumination.

8. The method of claim 1, further comprising optimizing the illumination and the portion of the design layout using a thin mask model, wherein the illumination is a freeform illumination.

9. The method of claim 1, wherein the obtaining the the patterning device defocus value comprises:
    determining a plurality of mask defocus values using a plurality of pupil profiles, or
    averaging several mask defocus values.

10. A computer program product comprising a non-transitory computer readable medium having instructions therein, the instructions, upon execution by a computer system, configured to cause the computer system to at least:
    optimize a patterning device defocus value of a lithographic process for imaging a portion of a design layout onto a substrate using a lithographic projection apparatus; and
    optimize, based on a simulation and on the patterning device defocus value, the portion of the design layout for each of a plurality of slit positions of illumination, for a patterning device, to be produced by an illumination system of the lithographic projection apparatus.

11. The computer program product of claim 10, wherein the instructions, when executed by the computer system, are further configured to optimize the portion of the design layout wherein transmission at all locations of the portion of the design layout is not restricted to a number of discrete values.

12. The computer program product of claim 10, wherein the instructions, when executed by the computer system, are further configured to determine, for each of the slit positions, a process window.

13. The computer program product of claim 10, wherein the instructions, when executed by the computer, are further configured to optimize the illumination and the portion of the design layout using a three-dimensional mask model, under an assumption that the illumination is a freeform illumination.

14. The computer program product of claim 10, wherein the illumination comprises EUV radiation and the illumination is arranged to have oblique chief rays incident on the patterning device.

15. A computer program product comprising a non-transitory computer readable medium having instructions therein, the instructions, upon execution by a computer system, configured to cause the computer system to at least:
perform a first optimization, based on a simulation, the first optimization involving optimizing of a portion of a design layout for imaging by a lithographic process onto a substrate using a lithographic projection apparatus, with an illumination to be produced by the lithographic projection apparatus, wherein the illumination is a freeform illumination and the first optimization involves changing the portion of the design layout and/or the freeform illumination;
map the freeform illumination resulting from the first optimization to a discrete illumination; and
perform a second optimization, the second optimization involving optimizing of the portion of the design layout with the discrete illumination, wherein the second optimization involves changing the portion of the design layout and/or the discrete illumination.

16. The computer program product of claim 15, wherein, in at least the first optimization, transmission at all locations of the portion of the design layout is not restricted to a number of discrete values.

17. The computer program product of claim 15, wherein the first optimization involves use of a three-dimensional mask model.

18. The computer program product of claim 15, wherein the instructions are further configured to cause the computer system to obtain a patterning device defocus value, which patterning device defocus value is used in the first and/or second optimization.

19. The computer program product of claim 15, wherein the instructions are further configured to cause the computer system to perform a third optimization, the third optimization involving optimizing of the portion of the design layout for each of a plurality of slit positions of illumination, for a patterning device, to be produced by an illumination system of the lithographic projection apparatus.

20. The computer program product of claim 15, wherein the illumination comprises EUV radiation and the illumination is arranged to have oblique chief rays incident on the patterning device.

* * * * *